Figure 1:
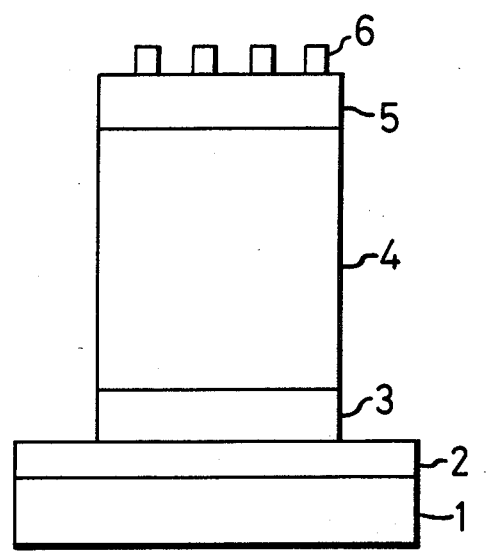

United States Patent [19]

Hockley et al.

[11] Patent Number: 4,567,499
[45] Date of Patent: Jan. 28, 1986

[54] MEMORY DEVICE

[75] Inventors: Peter J. Hockley, Swindon; Michael J. Thwaites, Hook, both of England

[73] Assignee: The British Petroleum Company p.l.c., London, England

[21] Appl. No.: 494,009

[22] Filed: May 12, 1983

[30] Foreign Application Priority Data

May 15, 1982 [GB] United Kingdom ............... 8214204

[51] Int. Cl.⁴ ............................................ H01L 45/00
[52] U.S. Cl. ........................................ 357/2; 357/59; 357/4
[58] Field of Search ......................... 357/2, 59, 57, 4

[56] References Cited

U.S. PATENT DOCUMENTS

| | | | |
|---|---|---|---|
| 3,571,670 | 3/1971 | Ovshinsky | 307/234 |
| 3,571,672 | 3/1971 | Ovshinsky | 307/324 |
| 3,571,673 | 3/1971 | Ovshinsky | 307/324 |
| 3,740,620 | 6/1973 | Agusta | 317/235 R |
| 3,758,797 | 9/1973 | Peterson | 307/324 |
| 3,796,931 | 3/1974 | Mante | 317/235 R |
| 4,064,521 | 12/1977 | Carlson | 357/2 |
| 4,177,474 | 12/1979 | Ovshinsky | 357/2 |
| 4,203,123 | 5/1980 | Shanks | 357/2 X |
| 4,226,643 | 10/1980 | Carlson | 136/258 |
| 4,371,883 | 2/1983 | Potember | 357/2 X |
| 4,398,343 | 8/1983 | Yamazaki | 352/2 X |
| 4,453,173 | 6/1984 | Carlson | 357/2 X |
| 4,476,346 | 10/1984 | Tarvada | 357/2 X |
| 4,485,389 | 11/1984 | Ovshinsky | 357/2 |

OTHER PUBLICATIONS

I.E.E. Proc., vol. 129, Pt. 1 Apr. 2, 1982, pp. 51–54, "New Amorphous–Silicon Electrically Programmable Nonvolatile Switching Device", Prof. A. E. Owen, P. G. LeComber, G. Sarrabayrouse and W. E. Spear.

Primary Examiner—Martin H. Edlow
Attorney, Agent, or Firm—Morgan, Finnegan, Pine, Foley & Lee

[57] ABSTRACT

Memory device comprises a glass substrate (1), a layer of indium tin oxide (2), a layer of p type semiconductor (3), a layer of i type semiconductor (4), a layer of n type semiconductor (5) and a layer of spots of an electrically conducting material (6). Silicon is the preferred semiconductor. The device is conditioned by the application of a voltage sufficiently large to cause the structure to be permanently modified to reduce the electrical resistance of the layers.

It is a feature of the device that no p and n layers are adjacent.

6 Claims, 3 Drawing Figures

MEMORY DEVICE

This invention relates to a memory device of novel structure incorporating amorphous or microcrystalline semiconducting material and to a process for the production of amorphous silicon suitable for use in such a device.

A memory device based on amorphous silicon has previously been disclosed. IEE Proc. Vol 129, Pt 1, No 2, April 1982, pages 51-54 discloses a structure consisting in its simplest form of p and n layers deposited onto a conducting stainless steel substrate. The layered structure is conditioned into a memory device by applying a large forward bias which enables the structure to be put into a stable state (either "on" or "off") by applying a voltage pulse of known polarity. The device can then be switched to an alternative "on" or "off" state by applying a voltage pulse above a certain threshold such as 4 V with opposite polarity to the original pulse.

We have now discovered that memory devices having a different configuration of silicon layers in which no two p and n layers are adjacent have this property (which is herein referred to as a memory), that similar devices can also be made on substrates permeable to light and that such memory devices can be influenced by light.

Thus according to the present invention there is provided a memory device comprising an electrically conducting substrate and layers of i and p and/or n type amorphous or microcrystalline semiconducting material which have been conditioned by the application of a voltage sufficiently large to cause the structure to be permanently modified to reduce the electrical resistance of the layers wherein no p and n layers are adjacent in the device.

We believe that the operation of the device according to the present invention is governed by the properties of the i layer thereby giving enhanced control of the device.

It is to be understood that p type and n type include p and p+ and n and n+ within their respective scopes.

Preferably, layers of p type and i type amorphous or microcrystalline semi-conducting material are deposited on to the substrate to form a p-i configuration.

Most preferably an additional layer of n type amorphous or microcrystalline semi-conducting material is deposited to form a p-i-n configuration.

The amorphous or microcrystalline semi-conducting material is preferably silicon.

The substrate can be a modified glass, the surface of which has been rendered electrically conducting by a layer of tin oxide, indium tin oxide or other light permeable electrical conducting material. An advantage of using an optically transparent substrate in that light may be used to affect the stable states of the device.

The substrate may also be a similarly treated quartz.

Desirably the device includes one or more electrically conducting areas on the outer surface of the silicon layer remote from the substrate. These areas can conveniently be provided by strips or spots of a metal such as aluminium.

The layer of i type material can be prepared by methods known in the art, for example by decomposing a gaseous hydrogen-containing precursor of the material, e.g., silane, in a glow discharge. The layers of p type and n type material can be prepared by adding diborane or phosphine respectively in varying quantities to the precursor.

According to another aspect of the present invention there is provided a method for the preparation of an amorphous semi-conducting material suitable for use in a memory device which method comprises the step of decomposing a gaseous hydrogen-containing precursor of the semi-conducting material in the presence of hydrogen wherein the concentration of the precursor in hydrogen is below that at which spontaneous combustion occurs and the pressure is controlled to form amorphous material.

A suitable precursor is silane.

The concentration of the precursor in hydrogen is preferably not greater than 5% by volume.

The total pressure is preferably in the range 1 to 5 torr.

The conditioning voltage is preferably in the range 5 to 20 volts greater than the threshold switching voltage. Once conditioned, the device can be put into either of two stable states, "on" or "off", by applying a voltage above a certain threshold, usually approximately 4 volts, and reversed by applying a voltage of the opposite polarity to its predecessor.

The device is non-volatile, that is to say, once the device has been put into one of the stable states, it remains there even if the power to the device is removed.

The invention is illustrated by the following Examples.

EXAMPLE 1

An ITO (indium tin oxide) coated glass substrate was placed on a temperature variable substrate holder, the whole being inside a cylindrical Pyrex reaction chamber. The chamber was evacuated to $10^{-2}$ torr with a trapped rotary pump and the substrate heated to 300° C. A mixture of 4% by volume silane in hydrogen was admitted to the chamber to bring the pressure up to about 3 torr. Once the pressure had stabilised 2% by vol of diborane was added to the silane in the chamber. A glow discharge was initiated by exciting external coils encircling the pyrex vessel from a LFE radio frequency generator operating at 13.56 MHz. This caused p type amorphous silicon containing boron to be deposited on the ITO coated glass from the gas phase. After one minute the diborane flow was terminated, thus causing a region of intrinsic (or undoped) material to be produced on top of the p type region. This situation was maintained for 30 minutes. Finally, 0.1% by vol phosphine was progressively admitted to the reaction chamber and growth continued for a further six minutes. This caused n type amorphous silicon containing phosphorus to be deposited on top of the i type material. At this stage the discharge was extinguished, the phosphine flow was stopped and the device was allowed to cool under a flow of 4% silane in hydrogen. When the device had cooled to room temperature it was removed from the reaction chamber and placed in a vacuum coater, where several spots of aluminium 2 mm in diameter were evaporated onto the surface of the device.

The complete structure is shown in FIG. 1 wherein 1 represents the glass substrate, 2 the layer of ITO, 3 the layer of p type silicon, 4 the layer of i type, 5 the layer of n type and 6 the aluminium spots. The p layer is about 200 Å thick, the n layer about 500 Å and the i layer about 4300 Å.

Figure 2:
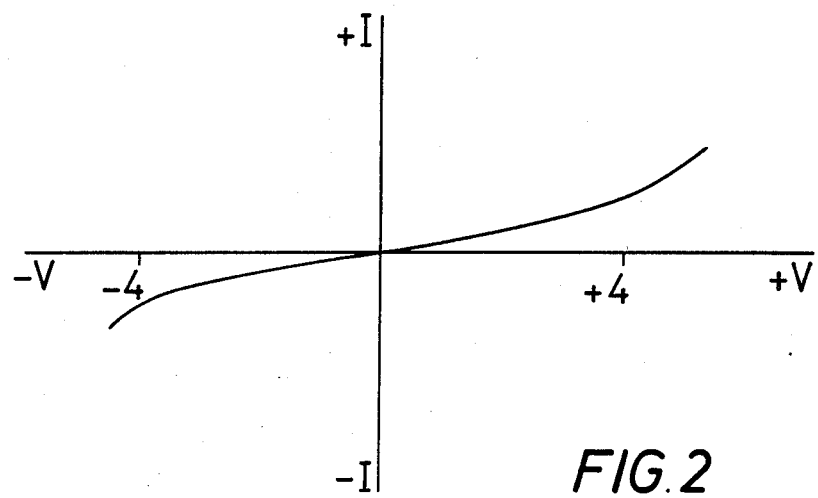

The device was placed on a curve tracer and its voltage/current characteristics examined. Usually they were of the form as shown in FIG. 2. Finally a large voltage (10–20 V) was applied to the device. This step 'conditions' the device into a memory (switching) device with the characteristics as shown in FIG. 3.

Figure 3:
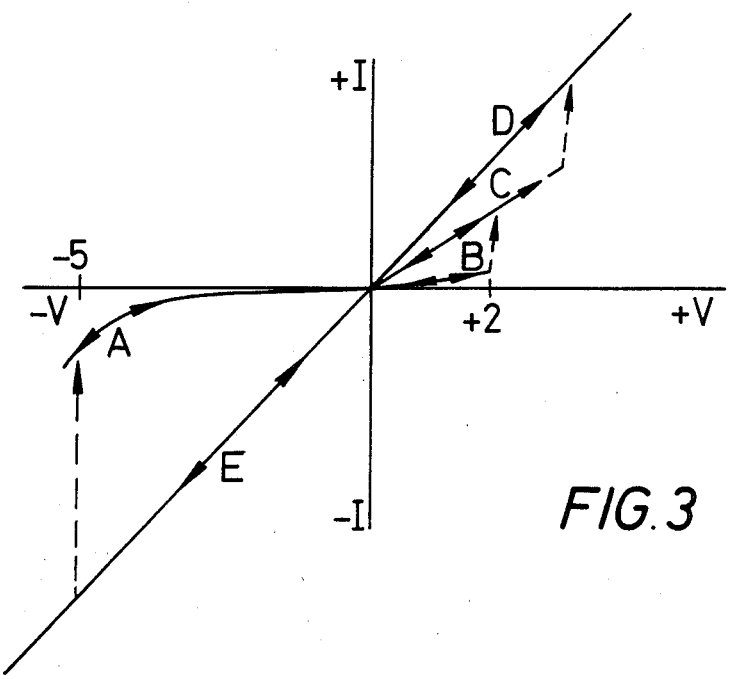

Curves A and B in FIG. 3 show the device in its OFF state. Applying negative bias (curve A) has no effect on the conductivity state, applying forward bias (curve B) causes the device to switch to an intermediate conductivity state (curve C) at about 2 V. Further forward bias finally switches the device to its ON state, (curve D). Higher forward potentials have no further effect on the conductivity state. Applying negative bias now leaves the device in the ON state (curve E) until a potential of 5 V is obtained, whereupon it immediately switches to its OFF state (curve A). This sequence of events is repeatable with no change in the ON-OFF conductivity or switching levels.

EXAMPLE 2

A similar device was constructed from microcrystalline material. This was prepared in a similar manner to that disclosed in Example 1 with the difference that the deposition pressure was reduced to 0.8 torr. It was then conditioned as before.

We claim:

1. A memory device comprising an electrically conducting substrate and layers of i and p and/or n type amorphous or microcrystalline semiconducting material which have been conditioned by the application of a voltage sufficiently large to cause the structure to be permanently modified to reduce the electrical resistance of the layers wherein no p and n layers are adjacent in the device.

2. A memory device according to claim 1 wherein layers of p type and i type amorphous or microcrystalline semi-conducting material are deposited on the substrate to form a p-i configuration.

3. A memory device according to claim 2 wherein an additional layer of n type amorphous or microcrystalline semiconducting material is deposited to form a p-i-n configuration.

4. A memory device according to claim 1 wherein the amorphous or microcrystalline semi-conducting material is silicon.

5. A memory device according to claim 1 wherein the substrate is glass, the surface of which has been rendered electrically conducting by a layer of tin oxide or indium tin oxide.

6. A memory device according to claim 1 wherein the structure includes one or more electrically conducting areas on the outer surface of the semi-conductor layer remote from the substrate.

* * * * *